United States Patent
Deshpande et al.

(10) Patent No.: US 8,907,225 B1
(45) Date of Patent: Dec. 9, 2014

(54) STRUCTURES AND METHODS RELATED TO DETECTION, SENSING, AND/OR MITIGATING UNDESIRABLE STRUCTURES OR INTRUSION EVENTS ON STRUCTURES

(71) Applicant: The United States of America as represented by the Secretary of the Navy, Washington, DC (US)

(72) Inventors: Nishkamraj U Deshpande, Novi, MI (US); H. Fred Barsun, Bloomington, IN (US); Ron Shoultz, Crane, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/221,833

(22) Filed: Mar. 21, 2014

Related U.S. Application Data

(60) Provisional application No. 61/810,929, filed on Apr. 11, 2013.

(51) Int. Cl.
  *H05K 1/02* (2006.01)
  *H05K 3/28* (2006.01)
  *H01L 23/31* (2006.01)
  *H05K 3/30* (2006.01)

(52) U.S. Cl.
  CPC .............. *H05K 1/0275* (2013.01); *H05K 3/305* (2013.01)
  USPC .............. 174/251; 29/841; 257/767; 257/790

(58) Field of Classification Search
  USPC ................... 257/787–790; 438/127; 174/251; 29/841
  See application file for complete search history.

(56) References Cited

U.S. PATENT DOCUMENTS

| | | | | |
|---|---|---|---|---|
| 7,391,116 B2* | 6/2008 | Chen et al. | ..................... | 257/762 |
| 7,604,871 B2* | 10/2009 | Jackson et al. | ................ | 428/626 |
| 7,808,109 B2* | 10/2010 | Chen et al. | ..................... | 257/762 |
| 8,055,594 B2* | 11/2011 | Dhanekula et al. | ............. | 706/12 |
| 8,209,859 B2* | 7/2012 | Feinstein | ........................ | 29/841 |
| 8,329,248 B2* | 12/2012 | Jackson et al. | ................ | 427/96.2 |
| 8,653,375 B2* | 2/2014 | Osenbach | ................. | 174/126.2 |
| 8,834,747 B2* | 9/2014 | Zinn | ............................. | 252/513 |
| 2007/0284700 A1* | 12/2007 | Jackson et al. | ................ | 257/642 |
| 2007/0287022 A1* | 12/2007 | Jackson et al. | ................ | 428/624 |
| 2007/0287023 A1* | 12/2007 | Jackson et al. | ................ | 428/624 |
| 2007/0293530 A1* | 12/2007 | Smil et al. | ..................... | 514/292 |
| 2008/0216704 A1* | 9/2008 | Eisenbeis et al. | .......... | 106/14.05 |
| 2010/0132978 A1* | 6/2010 | Yen et al. | .................... | 174/126.2 |
| 2011/0206909 A1* | 8/2011 | Sneh | .......................... | 428/195.1 |
| 2012/0090880 A1* | 4/2012 | Kline | ............................ | 174/257 |
| 2012/0107639 A1* | 5/2012 | Takamizawa et al. | ........ | 428/620 |
| 2012/0177945 A1* | 7/2012 | Yen et al. | ...................... | 428/641 |
| 2013/0048356 A1* | 2/2013 | Kline | ............................ | 174/257 |
| 2014/0060907 A1* | 3/2014 | Kline | ............................ | 174/257 |

* cited by examiner

Primary Examiner — Evan Pert

(74) Attorney, Agent, or Firm — Christopher A. Monsey

(57) ABSTRACT

A method and an apparatus for mitigating electrical failures caused by intrusive structures. Such structures can be tin whiskers forming on electrical circuits. In an illustrative embodiment, nano-capsules are filled with some type of insulative and adhesive fluid that is adapted to bind to and coat an intrusive structure, e.g., a whisker, making the whisker electrically inactive and thereby reducing the electrical faults that can be caused by the whisker. In another illustrative embodiment, randomly oriented nano-fibers having an elastic modulus higher than tin or any other whisker material is used to arrest a growth or movement of a whisker and further reduce a likelihood that a whisker can cause an electrical fault.

29 Claims, 12 Drawing Sheets

STRUCTURES AND METHODS RELATED TO DETECTION, SENSING, AND/OR MITIGATING UNDESIRABLE STRUCTURES OR INTRUSION EVENTS ON STRUCTURES

CROSS-REFERENCE TO RELATED APPLICATIONS

The present application claims priority to U.S. Provisional Patent Application Ser. No. 61/810,929, filed Apr. 11, 2013, entitled "STRUCTURES AND METHODS RELATED TO DETECTION, SENSING, AND/OR MITIGATING UNDESIRABLE STRUCTURES OR INTRUSION EVENTS ON STRUCTURES," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 102,519) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The invention relates to the sensing or detection of undesirable structures or intrusion events, such as tin whiskers, a tampering event, or an attempt to create a counterfeit device through alteration or unauthorized use of an electronic device, using a variety of structures and processing techniques. Current types of conformal coatings as applied on circuit boards are not able to prevent undesirable structure growth, such as tin or other whisker growth, through them. Furthermore, the undesirable structures that grow from current conformal coatings are problematic since they can create many short circuits and failures by conducting undesired current through them. One aspect or embodiment of the invention addresses this issue by providing a nano-fiber textile matrix above the conformal coated circuit board or by providing a conformal coat possessing a material such as a nano-fiber textile. Another embodiment of this invention utilizes encapsulating structures such as micro- or nano-tubes or micro- or nano-capsules containing a chemical fluid, such that when the undesirable structure ruptures the encapsulating structures, the fluid coats the undesirable structure with an electrically insulative layer. Thus, if the whisker emerges from the coating surface, it will have an electrically insulating coating material on its surface, rendering it electrically inactive and preventing electrical conduction.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
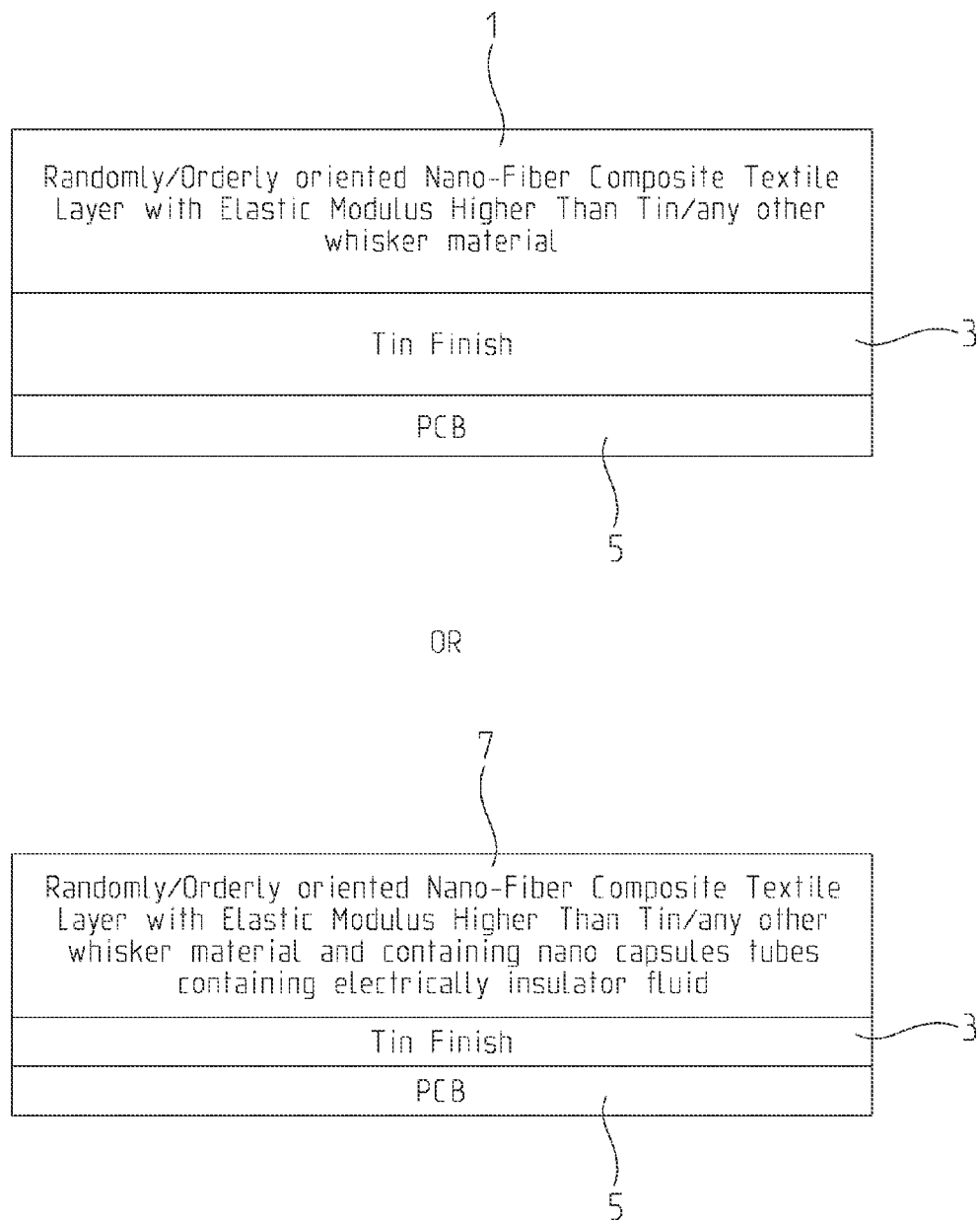
FIG. 1 is a diagram of a whisker mitigation system according to an illustrative embodiment of the invention.

Referring initially to FIG. 1, a simplified structure in accordance with one aspect or embodiment of the invention is shown. A printed circuit board (PCB) 5 is provided with a conformal coating 3 as a first layer and a randomly oriented nano-fiber composite textile layer with elastic modulus higher than tin or any other whisker material 1 formed on top of the conventional conformal coating 3 as a second layer. Alternatively, the PCB 5 is provided with the conformal coating 3 as a first layer and a second layer 7 formed on it comprising a randomly or non-randomly oriented nano-fiber composite textile with elastic modulus higher than tin or any other whisker material, where the elastic modulus is a measure of stiffness of an elastic material, and containing nano-capsules or nano-tubes containing electrically insulative liquid. An alternative embodiment for conformal coating 3 is that of a tin finish or a solder coating.

Figure 2:
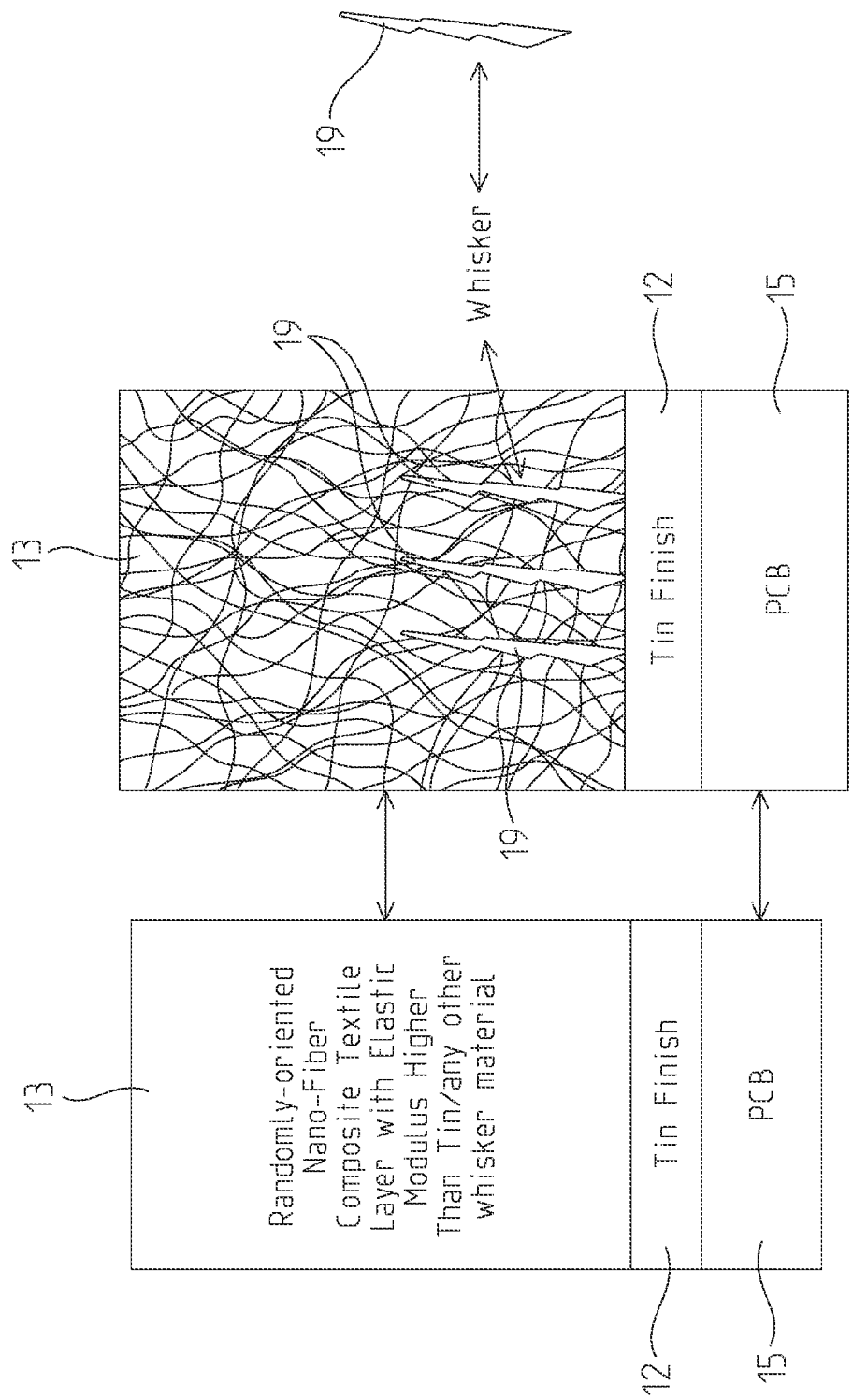
FIG. 2 is a diagram of a nano-fiber whisker mitigation system according to an illustrative embodiment of the invention.

Referring to FIG. 2, a simplified structure in accordance with one aspect or embodiment of the invention is shown. A PCB 15 is provided with a conformal coating as a first layer 12 and with a second layer 13 formed on it comprising a randomly or non-randomly oriented nano-fiber composite textile with elastic modulus higher than tin or any other whisker material. Since the second layer 13 is composed of a material having an elastic modulus higher than tin or any other whisker material, as a whisker 19 grows or moves, the second layer 13 is likely to cause the whisker 19 to be deformed, bent, redirected, or to cause the movement of the whisker 19 to be slowed or stopped. The second layer 13 can act as a physical impediment to the whisker 19 and is a form of mechanical mitigation preventing the whisker 19 from creating electrical faults.

Figure 3:
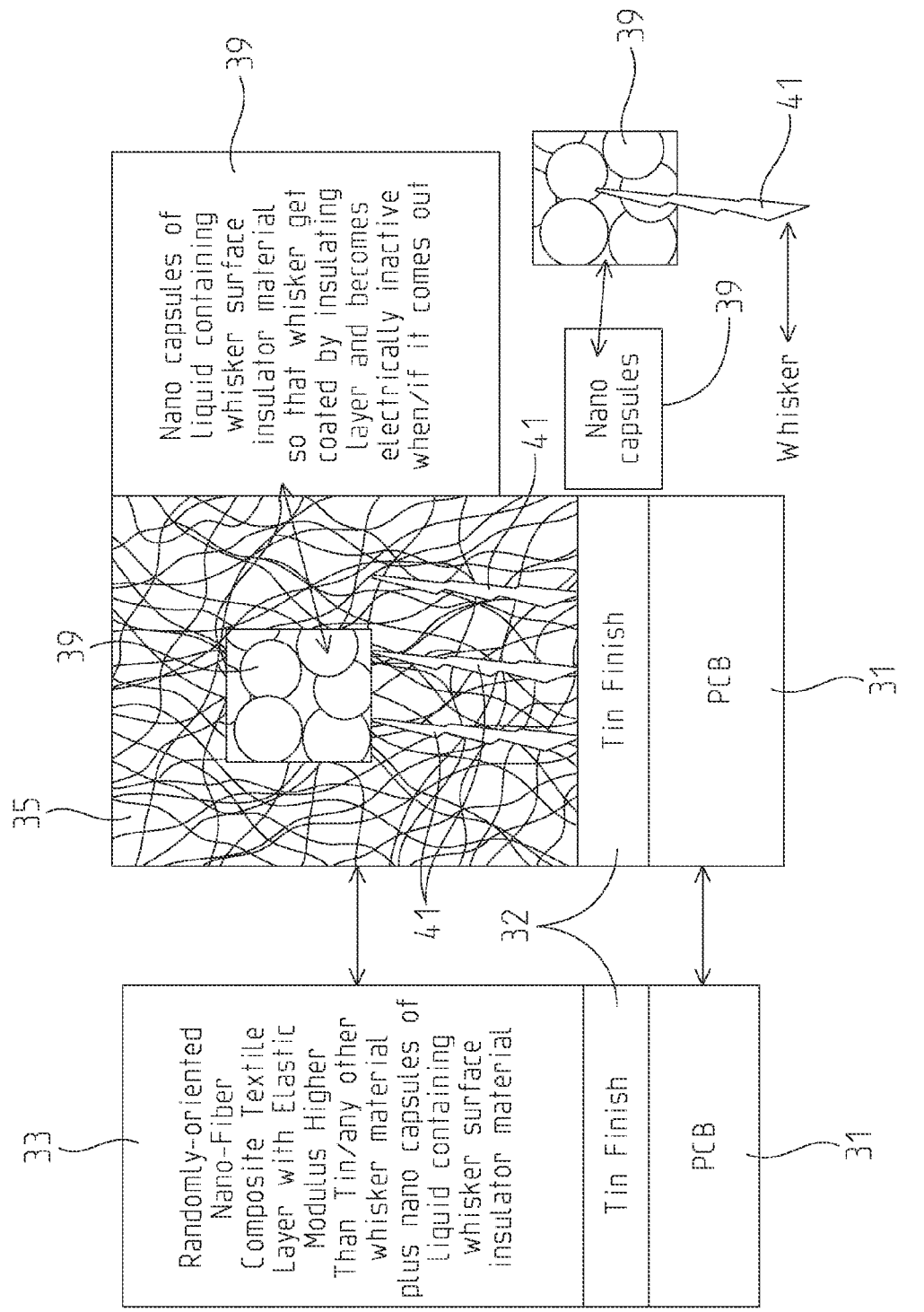
FIG. 3 is a diagram of a nano-fiber and nano-capsule whisker mitigation system according to an illustrative embodiment of the invention.

Referring to FIG. 3, a simplified structure in accordance with one aspect or embodiment of the invention is shown. A PCB 31 is provided with a conformal coating as a first layer 32 and a second layer 33 formed on the first layer 32 comprising a randomly or non-randomly oriented nano-fiber composite textile layer 35 with elastic modulus higher than tin or any other whisker material and nano-capsules 39 containing an electrically insulative liquid. The electrically insulative liquid is transferred from the nano-capsules 39 to the surface of a whisker 41 so that the whisker 41 is coated by an electrically insulative layer. The whisker 41, or other undesirable or intrusive structure, is rendered electrically inactive by the electrically insulative layer such that the whisker 41, or other undesirable or intrusive structure, will not cause electrical faults or short-circuits.

Figure 4:
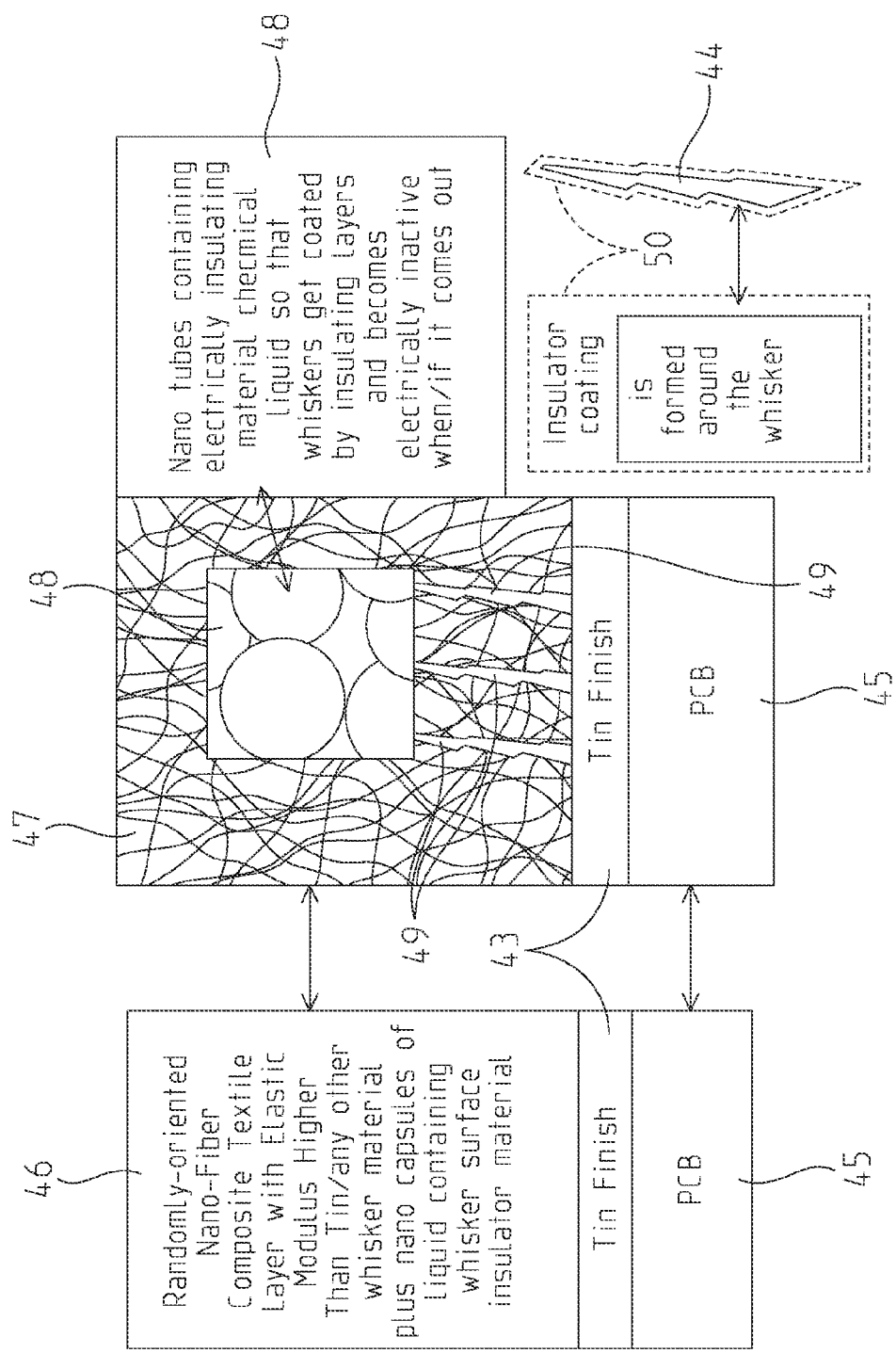
FIG. 4 is a diagram of a nano-fiber and nano-tube whisker mitigation system according to an illustrative embodiment of the invention.

Referring to FIG. 4, a simplified structure in accordance with one aspect or embodiment of the invention is shown. A PCB 45 is provided with a conformal coating as a first layer 43 and a second layer 46 comprising a randomly or non-randomly oriented nano-fiber composite textile 47 with elastic modulus higher than tin or any other whisker material and nano-tubes 48 containing an electrically insulative liquid. When a whisker 49, or other undesirable structure or material, cracks or punctures the nano-tubes 48, the electrically insulative liquid leaks out and is transferred from the nano-tubes 48 to the surface of the whisker 49 so that the whisker 49 is coated with an insulative coating layer 50 of the electrically insulative liquid. The whisker 49, or other undesirable structure or material, is rendered electrically inactive by the insulative coating layer 50 such that the whisker 49, or other undesirable structure or material, will not cause electrical faults or short-circuits.

Figure 5:
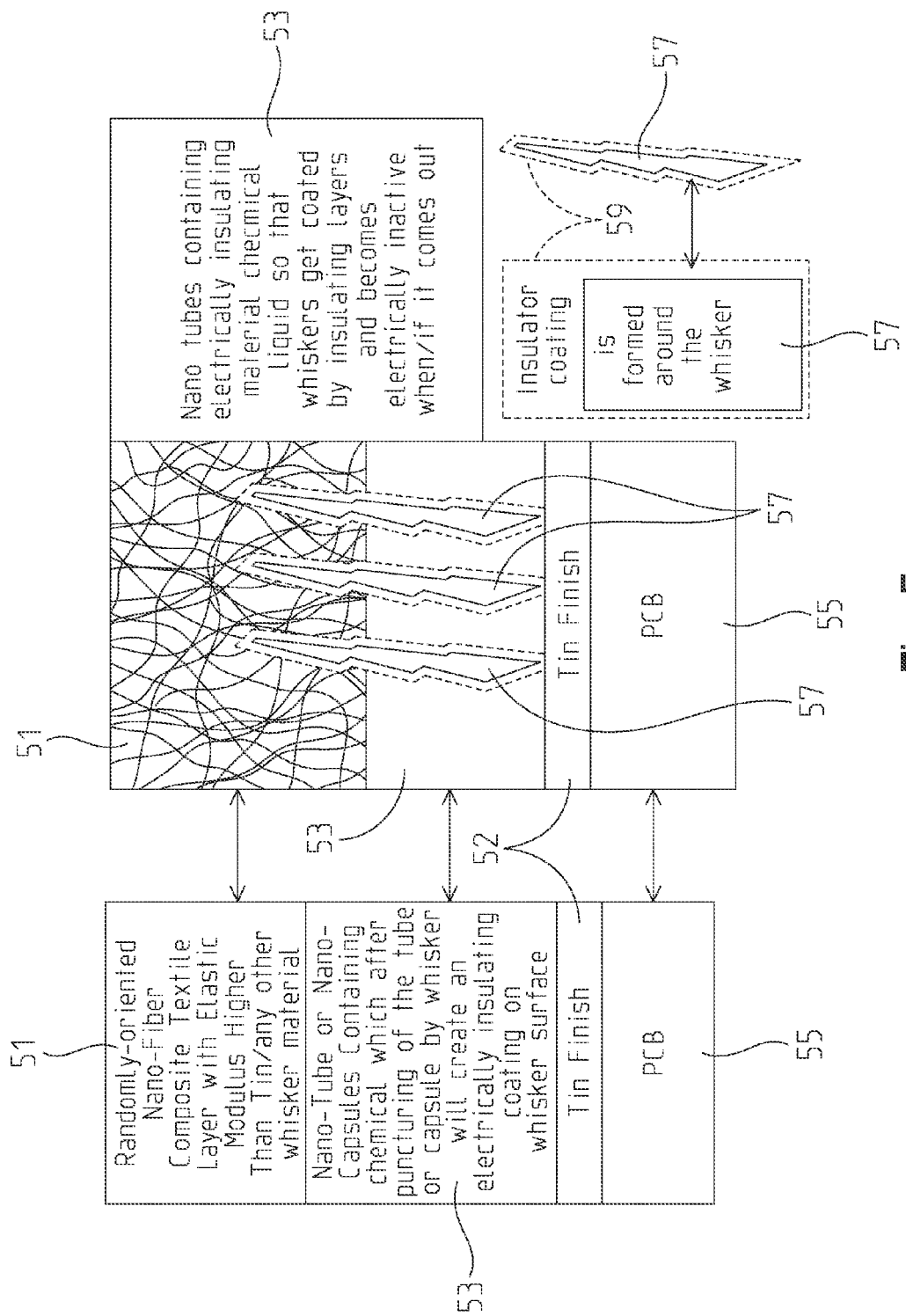
FIG. 5 is a diagram of a two-layer whisker mitigation system according to an illustrative embodiment of the invention.

Referring to FIG. 5, a simplified structure in accordance with one aspect or embodiment of the invention is shown. A PCB 55 is provided with a conformal coating as a first layer 52, a second layer 53 comprising nano-tubes or nano-capsules containing an electrically insulative liquid and a third layer 51 comprising a randomly or non-randomly oriented nano-fiber composite textile with elastic modulus higher than tin or any other whisker material. When a whisker 57, or other undesirable structure or material, cracks or punctures the nano-tubes or nano-capsules in the second layer 53, the electrically insulative liquid leaks out and is transferred from the nano-tubes or nano-capsules to the surface of the whisker 57, so that the whisker 57 is coated with an insulative coating layer 59 of the electrically insulative liquid. The whisker 57, or other undesirable structure or material, is rendered electrically inactive by the insulative coating layer 59 such that the whisker 57, or other undesirable structure or material, will not cause electrical faults or short-circuits. In one embodiment, the insulative chemical or liquid in the tubes can be injected into the tubes or containment structure under pressure to facilitate coating action of the chemical on the intrusive or undesirable structure. Additionally, alternative embodiments provide the insulative chemical or liquid inside a structure other than a tube but that performs the same or similar functions and provides similar multiple effects as the tube described herein (e.g., multi-intrusion vector diversion, selective action, insulator coating, capture effect, accelerant effect, etc.). For example, an exemplary liquid or chemical in accordance with one embodiment of the invention can also be formed within laminated or multi-walled containment structures, e.g., tubes, which have additional chemical or liquids which facilitate coating of the intrusive structures such as a material which accelerates drying or persistent coating of such intrusive structures e.g., tin whiskers.

The third layer 51 comprising a randomly or non-randomly oriented nano-fiber composite textile with elastic modulus higher than tin or any other whisker material can also act as a kind of barrier to the whisker 57. The third layer 51 can cause the whisker 57 to be deformed, bent, redirected, or to cause the movement of the whisker 57 to be slowed or stopped. Thus, the third layer 51 can act as a physical impediment to the whisker 57 and is a form of mechanical mitigation preventing the whisker 57 from creating electrical faults. The second layer 53 and third layer 51 can work together to ensure the whisker 57 does not create electrical faults by both physically preventing the whisker 57 from being able to contact other conducting materials and by coating the whisker 57 with an insulating material that causes the whisker 57 to be electrically inactive. In another embodiment of the invention, the third layer 51 can be between the first layer 52 and the second layer 53.

Figure 6:
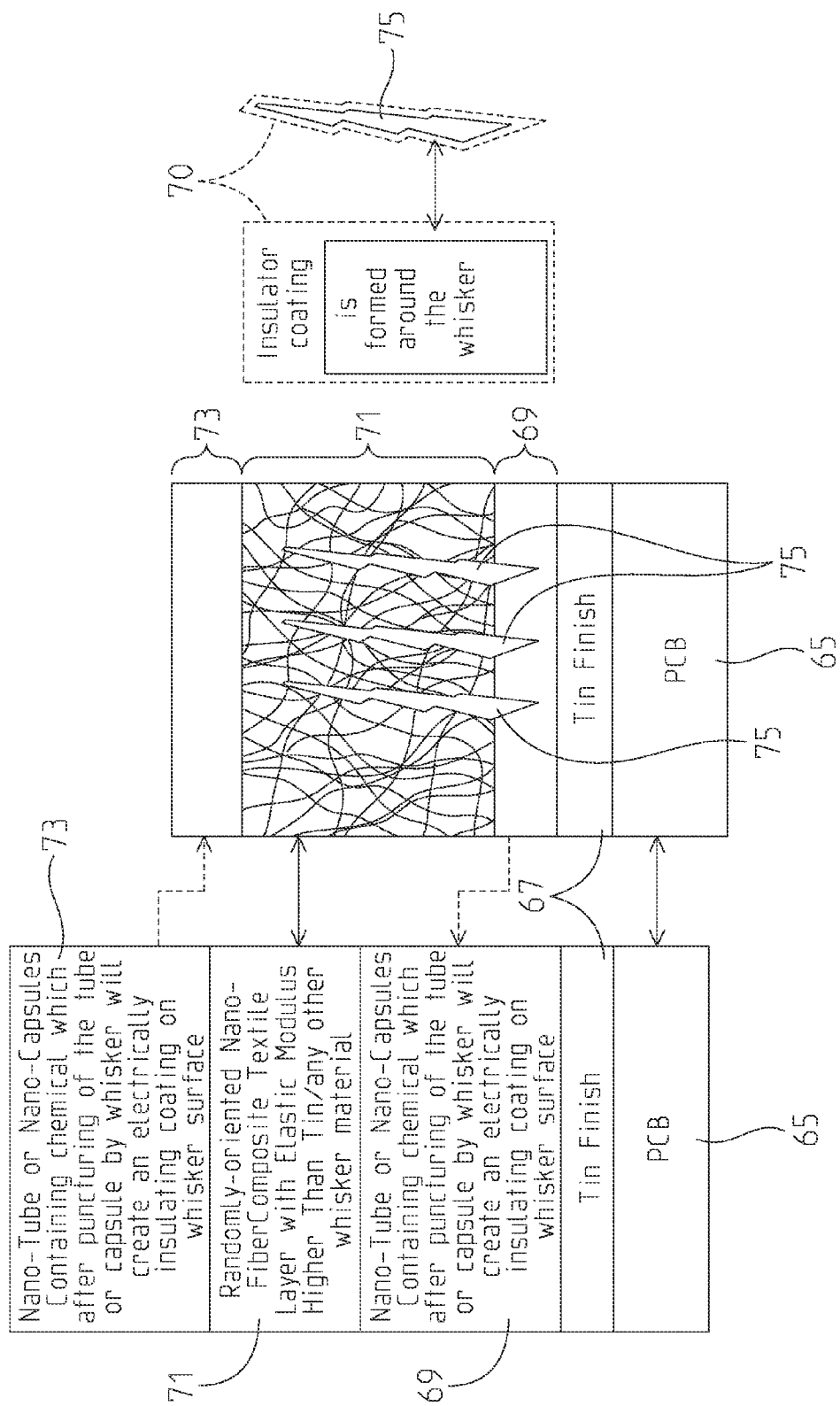
FIG. 6 is a diagram of a three-layer whisker mitigation system according to an illustrative embodiment of the invention.

Referring to FIG. 6, a simplified structure in accordance with one aspect or embodiment of the invention is shown. A PCB 65 is provided with a conformal coating as a first layer 67, a second layer 69 comprising nano-tubes or nano-capsules containing an electrically insulative material, a third layer 71 comprising randomly or non-randomly oriented nano-fiber composite, and a fourth layer 73 comprising nano-tubes or nano-capsules containing an electrically insulative liquid. When a whisker 75, or other undesirable structure or material, cracks or punctures the nano-tubes or nano-capsules in the second layer 69 or fourth layer 73, the electrically insulative liquid leaks out and is transferred from the nano-tubes or nano-capsules to the surface of the whisker 75, so that the whisker 75 is coated with an insulative coating layer 70 of the electrically insulative liquid. The whisker 75, or other undesirable structure or material, is rendered electrically inactive by the insulative coating layer 70 such that the whisker 75, or other undesirable structure or material, will not cause electrical faults or short-circuits. The third layer 71 can cause the whisker 75 to be deformed, bent, redirected, or to cause the movement of the whisker 75 to be slowed or stopped. Thus, the third layer 71 can act as a physical impediment to the whisker 75 and is a form of mechanical mitigation preventing the whisker 75 from creating electrical faults. The combination of the second layer 69, third layer 71 and fourth layer 73 provides added protection against electrical faults caused by the whisker 75. The physical impediments of the third layer 71 might have the adverse effect of removing some of the insulative coating layer 70 from the whisker 75, or the physical impediments of the third layer 71 might deform the whisker 75 such that uncoated surfaces of the whisker 75 have a higher likelihood of contacting another conductive material and creating an electrical fault. However, the fourth layer 73 provides an additional coating of the electrically insulative liquid to the whisker 75 and reduces the likelihood that the whisker 75 will create an electrical fault.

Figure 7:
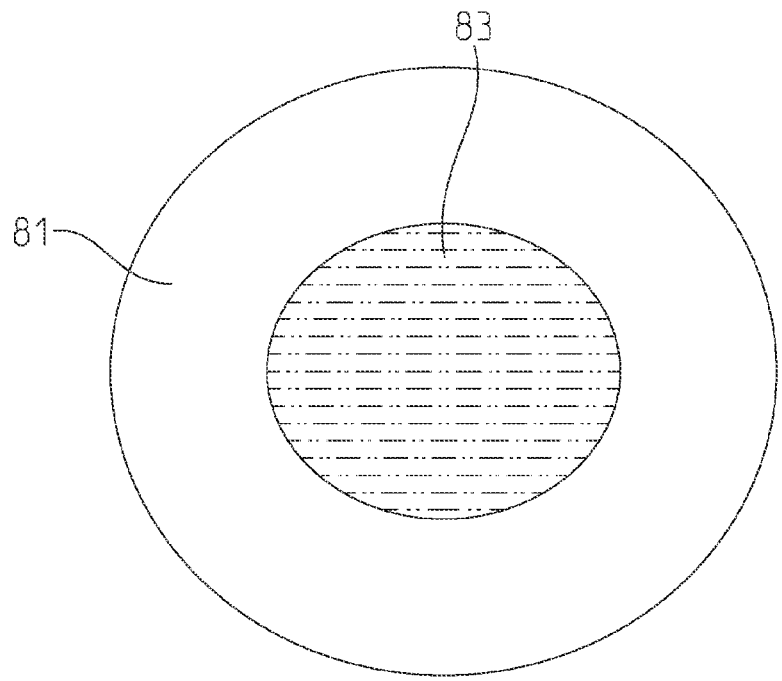
FIG. 7 is a diagram of a nano-capsule or nano-tube containing an insulator chemical according to an illustrative embodiment of the invention.

Referring to FIG. 7, a cross-sectional diagram of a nano-capsule or nano-tube according to an illustrative embodiment of the invention is shown. A nano-capsule or nano-tube wall 81 completely surrounds and encapsulates a liquid 83 such that the liquid 83 is not in fluid communication with any structure besides the nano-capsule or nano-tube wall 81. In one embodiment, the nano-capsule or nano-tube wall 81 can be made of melamine-formaldehyde or some other phenolic material that is frangible or breakable at least to metallic whiskers, and the liquid 83 can comprise a liquid that is both electrically insulative and an adhesive, such as an electrically insulative epoxy, silicone, polyurethane, polysulfide, cyanoacrylates, or other type of adhesive. Alternatively, an embodiment of the liquid 83 could be some combination of a plurality of epoxy, silicon oil, and 2-ethylhexanoic acid.

Figure 8:
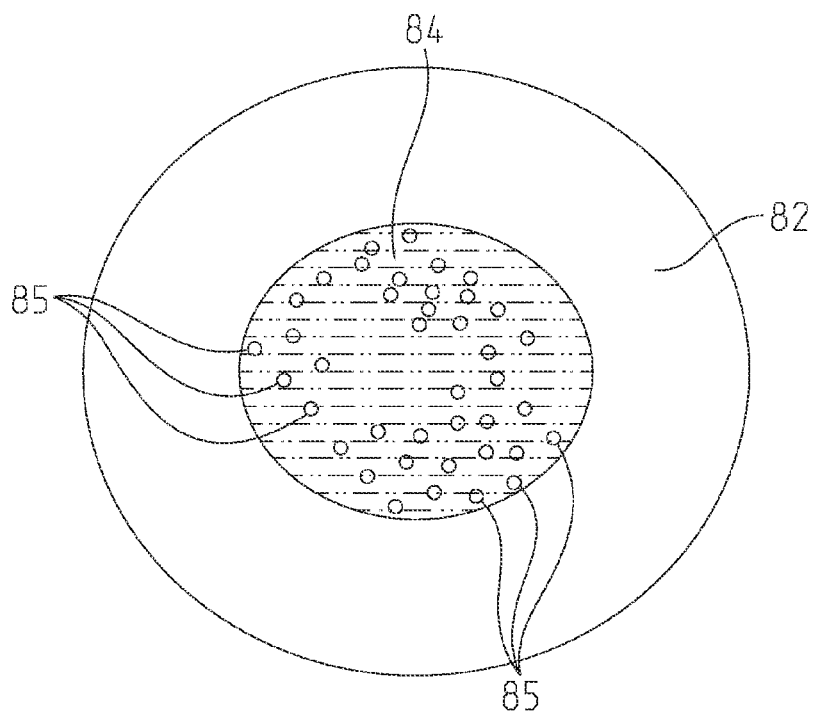
FIG. 8 is a diagram of a nano-capsule or nano-tube containing an insulator chemical and another detector chemical according to an illustrative embodiment of the invention.

Referring to FIG. 8, a cross-sectional diagram of a nano-capsule or nano-tube according to an illustrative embodiment of the invention is shown. A nano-capsule or nano-tube wall 82 surrounds and encapsulates a liquid 84 such that the liquid 84 is not in fluid communication with any structure besides the nano-capsule or nano-tube wall 82. The liquid 84 contains particles 85 that can be adapted or selected to be registerable on a sensor instrument. For example, in one embodiment, the particles 85 can include visual colorant so that after the nano-capsule or nano-tube wall 82 has been punctured by a puncturing structure, the liquid 84 leaks out of the nano-capsule or nano-tube releasing the particles 85 and allowing the particles 85 to color the surrounding materials such that the presence of a puncture can be detected. In another embodiment, the particles 85 can include formulations that interact with another nearby material, such as a matrix material that a nano-capsule is distributed into, and the interactions can be detected, e.g., in infrared. In another embodiment, the particles 85 may be detectable by EM spectrum analysis, whereby the particles 85 comprise materials and structures that create a specific EM spectrum reaction, pattern, or fingerprint (e.g., visual, EM spectrum detector, radio-frequency identification pattern, etc.). In another embodiment, the particles 85 comprise some type of phosphor/fluorescent material added to liquid 84. In another embodiment, the particles 85 can be adapted to enhance the elastic modulus of the surrounding structure when liquid 84 is released. Additionally, the particles 85 can aid in determining whether tampering or counterfeiting has occurred by providing a detectable reaction to said tampering or counterfeiting. If a piece of electronic equipment that is fitted with capsules as described above is tampered with, then the particles 85 will provide clear evidence of the stresses that the tampering induced. For example, in one of the described embodiments, the tampering will cause some of the capsules to rupture and release a detectable colorant.

Figure 9:
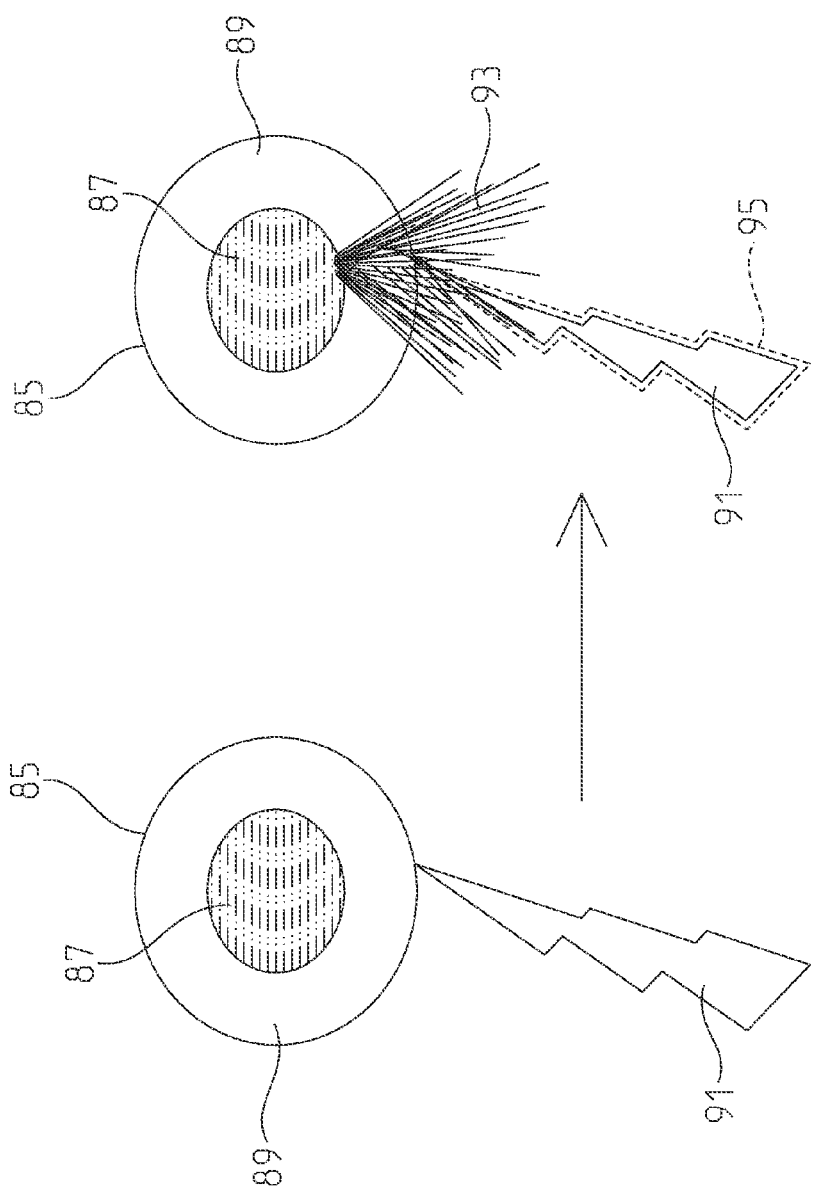
FIG. 9 is a diagram of a nano-capsule or nano-tube being punctured by a whisker according to an illustrative embodiment of the invention.

Referring to FIG. 9, a diagram of a nano-capsule or nano-tube 85 being punctured by a whisker 91 according to an illustrative embodiment of the invention is shown. The whisker 91 mechanically punctures a nano-capsule or nano-tube wall 89, which releases an insulative chemical 87 such that the whisker 91 is covered with a coating 95 of the insulative chemical 87. The insulative chemical 87 adhesively bonds to the whisker 91 in such a way that the insulative chemical 87 can obstruct the whisker 91 from growing further.

Figure 10:
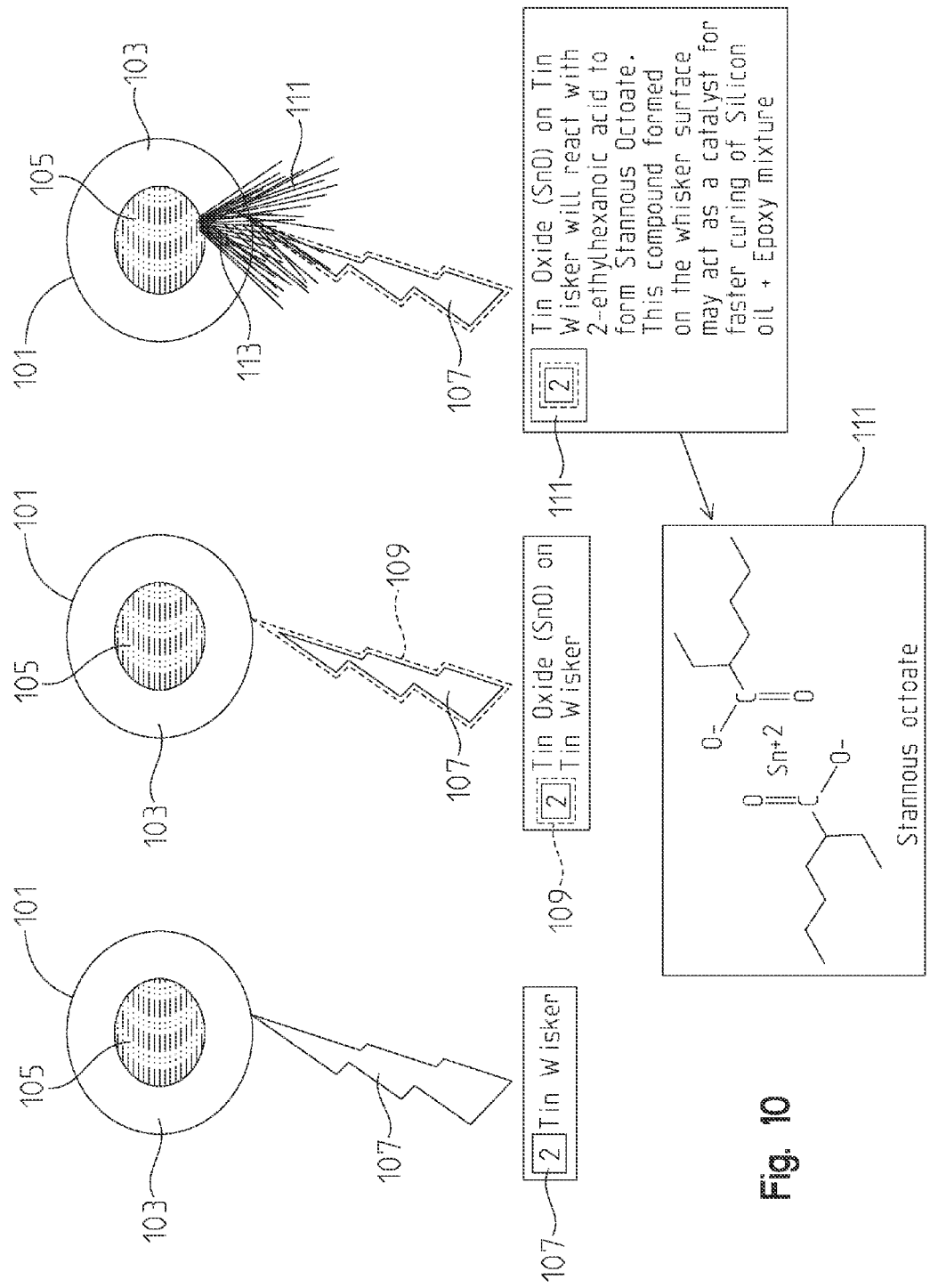
FIG. 10 is a diagram of insulator chemical binding to a whisker according to an illustrative embodiment of the invention.

Referring to FIG. 10, a diagram of an insulator chemical 105 binding to a whisker 107 according to an illustrative embodiment of the invention is shown. Nano-capsules or nano-tubes 101 are comprised of walls 103 that completely surround the insulator chemical 105 such that the insulator chemical 105 is not in fluid communication with any other object. In one embodiment of the invention, the insulator chemical 105 contains, for example, a 2-ethylhexanoic acid in the compound. During the formation of the whisker 107, a tin oxide film 109 (e.g., SnO or $SnO_2$) can form on the outside of the whisker 107. After the whisker 107 has punctured 113 the wall 103 of the nano-capsule or nano-tube, the insulator chemical 105 is released and coats the whisker 107. In one embodiment, the the 2-ethylhexanoic acid found in the insulator chemical 105 contacts the tin oxide film 109, resulting in a chemical reaction 111 that forms stannous octoate, which can act as a catalyst and cause the adhesive elements of the insulator chemical 105 to cure faster. Faster curing of the insulator chemical 105 can create a better insulative coating around the whisker 107. Accelerated curing caused by the chemical reaction 111 can also cause more of the surface of whisker 107 to be electrically inactive by helping the insulator chemical 105 to more fully cover and coat the whisker 107.

Figure 11:
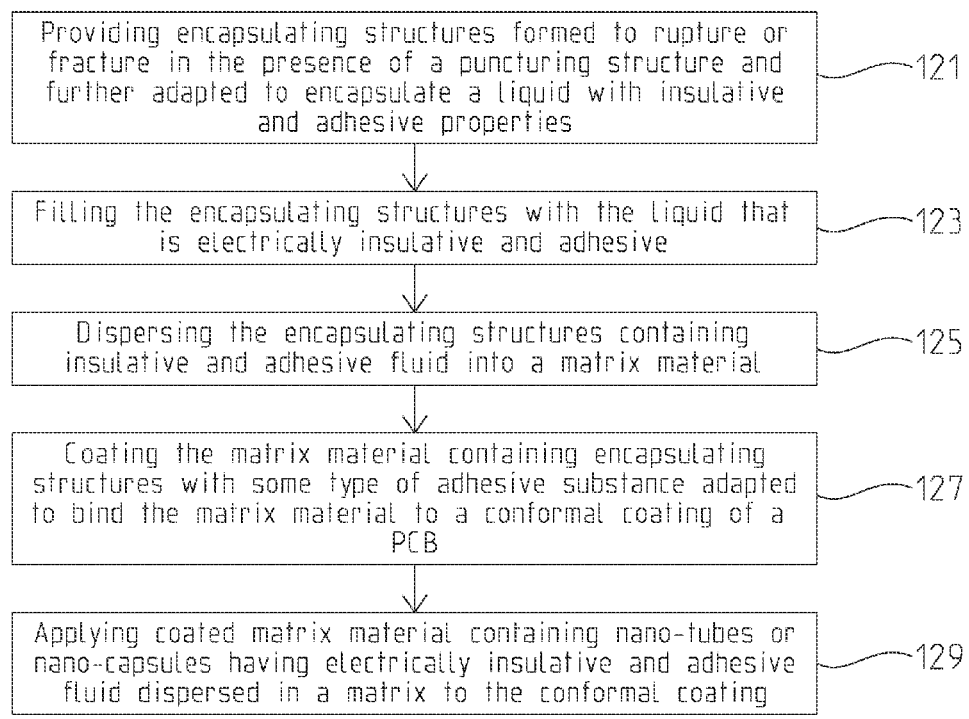
FIG. 11 is a diagram of a method of manufacture according to an illustrative embodiment of the invention.

Referring to FIG. 11, a diagram of a method of manufacture according to an illustrative embodiment of the invention is shown. Step 121 includes providing encapsulating structures formed to rupture or fracture in the presence of a puncturing structure and further adapted to encapsulate a liquid with insulative and adhesive qualities without chemically reacting to the liquid. Step 123 includes filling the encapsulating structures with a liquid that is electrically insulative and has adhesive properties. After filling the encapsulating structures with an insulator chemical, the encapsulating structures are dispersed into a matrix material, as in step 125. Next, in step 127, the matrix material containing the encapsulating structures is coated with some type of adhesive substance adapted to bind the matrix material to a conformal coating of a PCB. Finally, in step 129, the coated matrix material is applied to the conformal coating of the PCB such that the conformal coating and the coated matrix material adhere to one another. The filling step can include injecting the encapsulating structures with liquid under pressure or including a material in the encapsulating structures which induces a pressure to expel the liquid.

Figure 12:
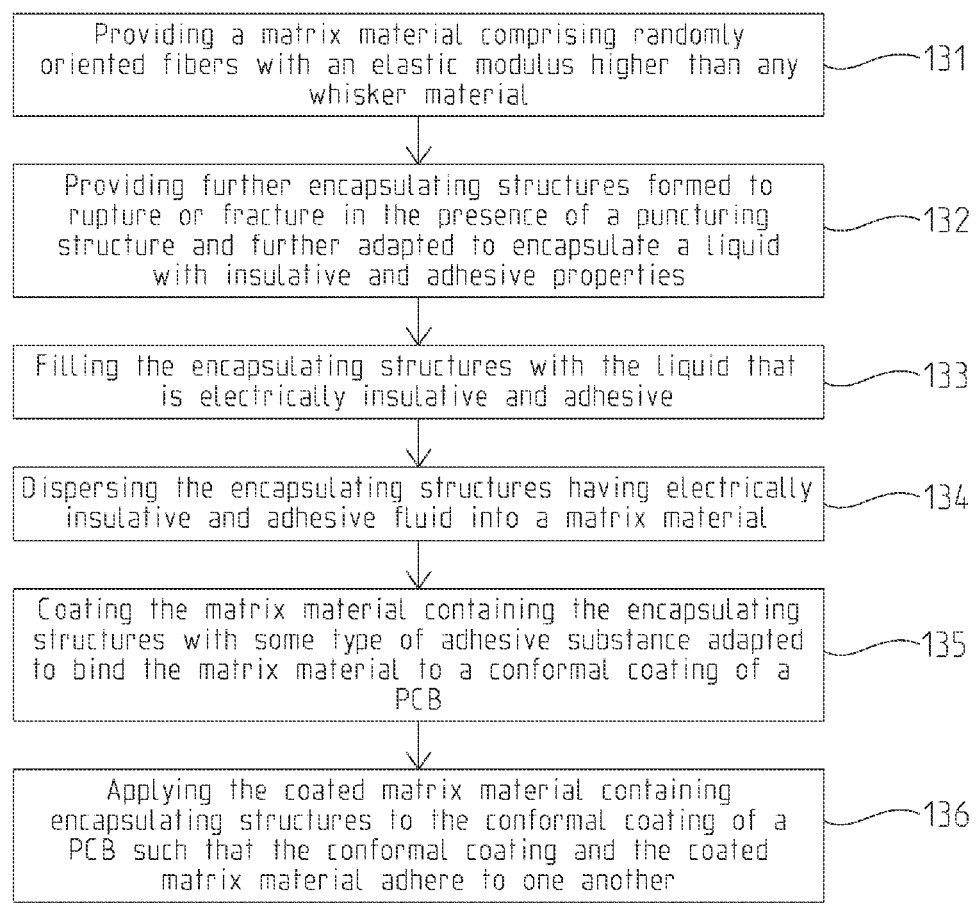
FIG. 12 is a diagram of a method of manufacture according to an illustrative embodiment of the invention.

Referring to FIG. 12, a diagram of a method of manufacture according to an illustrative embodiment of the invention is shown. Step 131 includes providing a matrix material comprising randomly oriented fibers adapted to have an elastic modulus higher than any whisker material. Step 132 includes providing further encapsulating structures formed to rupture or fracture in the presence of a puncturing structure and further adapted to encapsulate a liquid with insulative and adhesive properties. Step 133 includes filling the encapsulating structures with the liquid that is electrically insulative and adhesive. After the encapsulating structures are filled with an insulative chemical the encapsulating structures are then dispersed into the matrix material composed of randomly oriented fibers, as in step 134. Next, in step 135, the matrix material, now filled with encapsulating structures, is coated with some type of adhesive substance adapted to bind the matrix material to a conformal coating of a PCB. Finally, in step 136, the coated matrix material is applied to the conformal coating causing the matrix material to adhere to the conformal coating.

Figure 13:
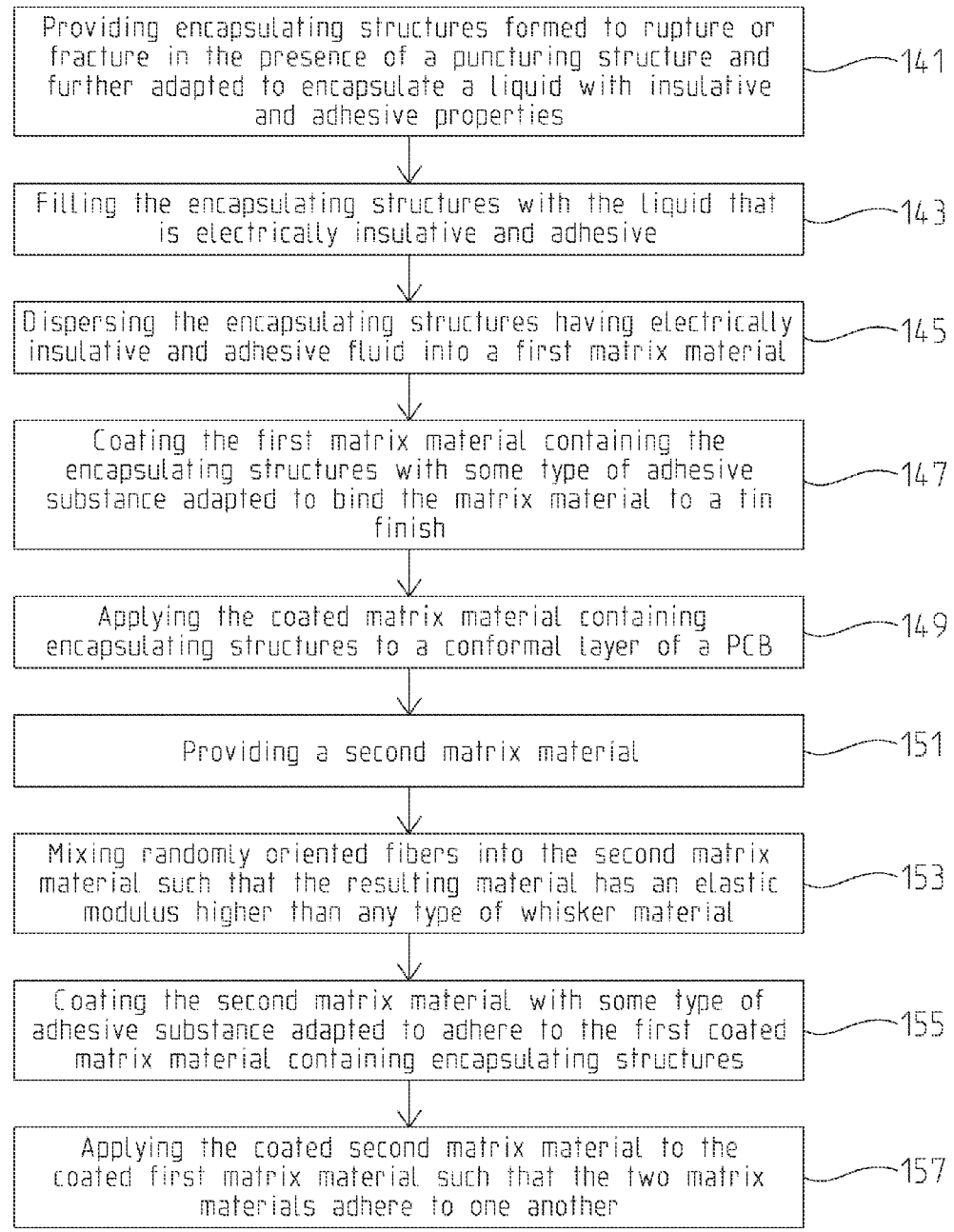
FIG. 13 is a diagram of a method of manufacture according to an illustrative embodiment of the invention.

Referring to FIG. 13, a diagram of a method of manufacture according to an illustrative embodiment of the invention is shown. Step 141 provides encapsulating structures formed to rupture or fracture in the presence of a puncturing structure and further adapted to encapsulate a liquid with insulative and adhesive properties. Next, in step 143, the encapsulating structures are filled with a liquid having both electrically insulative and adhesive properties. After filling the encapsulating structures with an insulator chemical, the encapsulating structures are dispersed into a first matrix material, as in step 145. Next, in step 147, the first matrix material containing encapsulating structures is coated with some type of adhesive substance adapted to bind the first matrix material to a conformal coating of a PCB. In step 149, the coated first matrix material is applied to the conformal coating causing the first matrix material to bond to the conformal coating. A second matrix material is provided in step 151. The second matrix material is then mixed with a randomly oriented fiber such that the resulting material has an elastic modulus higher than tin or any other type of whisker material, as in step 153. Next, in step 155, the second matrix material containing randomly oriented fibers is coated with some type of adhesive substance adapted to adhere to a coated matrix material containing encapsulating structures. Finally, in step 157, the coated second matrix material is applied to the coated first matrix material containing encapsulating structures such that the first matrix material adheres to the second matrix material.

In another exemplary embodiment, micro-tubes, micro-structures, or micro-capsules can be used instead of nano-tubes, nano-structures, or nano-capsules to encapsulate the insulative liquid, perform functions such as those described herein, or produce effects such as described associated with nano-scale structures described herein.

In another exemplary embodiment, the encapsulating structures, e.g., nano-capsules or nano-tubes, are provided with scribe lines or structural elements that result in a predetermined rupture or fracture in the encapsulating structure, allowing the insulative liquid contained therein to be transferred to specific locations or orientations relative to the encapsulating structure. For example, a selected portion of a wall of the encapsulating structure can be etched to form a weaker area of the encapsulating structure that is more susceptible to rupture or fracture, and thus ensure liquid is expelled in a particular direction or towards a specific location to which an intrusive structure poses a greater danger.

In another exemplary embodiment, the conformal coating comprises a tin finish or a solder coating and the layers and matrix material described above is adapted to adhere to a tin finish or solder coating.

Another exemplary embodiment can add or include a step of coating with or applying to the structures described herein (e.g., micro- or nano-tubes or micro- or nano-capsules containing insulative and adhesive liquid) some type of adhesive substance adapted to bind the structures to the conformal coating on the PCB.

An exemplary embodiment could also include use of a chemical or liquid in the tubes that can be injected into the tubes or containment structure under pressure to facilitate coating action of the chemical on the intrusive or undesirable structure. Note that a variety of embodiments of the invention can be created including alternative structures which contain the a suitable liquid or chemical which are in a structure besides a tube (e.g., box or laminate encapsulating structure), but perform the same or similar functions and provide similar multiple effects as a tube described herein e.g., multi-intrusion vector diversion, selective action, capture effects, insulator coating, capture effect, accelerant effect, etc. to name some of such effects For example, an exemplary liquid or chemical in accordance with one embodiment of the invention can also be formed within laminated or multi-walled containment structures, e.g., tubes, which have additional chemical or liquids which facilitate coating of the intrusive structures such as a material which accelerates drying or persistent coating of such intrusive structures e.g., tin whiskers.

Although the invention has been described in detail with reference to certain preferred embodiments, variations and modifications exist within the spirit and scope of the invention as described and defined in the following claims.

The invention claimed is:

1. An intrusive structure mitigation system comprising:
a plurality of first structures formed to encapsulate a liquid with insulative and adhesive properties which is formed or adapted to rupture or fracture upon a first pressure or intrusion event by a second structure and thereby enable said liquid to exit said rupture or fracture of at least one of said first structures upon occurrence of said first pressure or intrusion event; and
a first matrix material adapted to position and bond the plurality of first structures substantially distributed through or in relation to the first matrix material;
wherein said liquid is adapted to form an insulated coating on said second structure which intrudes or ruptures any one of said first structures thereby making at least a portion of the second structure electrically insulated from at least a portion of said second structure's environment or components said second structure comes in physical contact with or proximity with;
wherein said first matrix material is configured to bond to a conformal coating of a third structure comprising electrical components or conductors.

2. An intrusive structure mitigation system as in claim 1, wherein said plurality of first structures comprises a plurality of capsules or a plurality of tubes that are configured to encapsulate said liquid with insulative and adhesive properties.

3. An intrusive structure mitigation system as in claim 1, further comprising a second matrix material that comprises a plurality of randomly oriented fibers adapted to have an elastic modulus higher than said second structure material so as to divert or arrest movement of said second structure so as to reduce or eliminate an electrical contact with said third structure.

4. An intrusive structure mitigation system as in claim 3, wherein the second structure comprises a tin whisker.

5. An intrusive structure mitigation system as in claim 1, wherein said plurality of first structures comprises a plurality of nano- or micro-capsules or a plurality of nano- or micro-tubes that are configured to encapsulate said liquid with insulative and adhesive properties.

6. An intrusive structure mitigation system as in claim 3, wherein the second matrix material is configured to bond to the first matrix material on a side of the first matrix material that has not bonded to the conformal coating of said third structure.

7. An intrusive structure mitigation system as in claim 3, wherein the second matrix material is configured to bond to the conformal coating of said third structure creating a physical impediment to the formation and movement of a whisker thereby reducing the likelihood that a whisker causes an electrical fault.

8. An intrusive structure mitigation system as in claim 3, wherein a third matrix material configured to receive a plurality of fourth structures formed to encapsulate said liquid with insulative and adhesive properties.

9. An intrusive structure mitigation system as in claim 8, wherein said liquid with insulative and adhesive properties is configured to rapidly bond with said second structure after an enclosing fourth structure associated with at least one of said plurality of first structures has been punctured due to interaction with a material that causes said liquid to rapidly bond with said second structure.

10. An intrusive structure mitigation system as in claim 8, wherein the third matrix material is configured to bond to the second matrix material thereby creating at least three layers of impediments or barriers to a growth or movement of said second structure and further reducing a probability that said second structure can cause an electrical fault in said third structure.

11. An intrusive structure mitigation system as in claim 1, wherein said first matrix material contains randomly oriented fiber composite textile configured or formed to have an elastic modulus higher than said second structure, wherein said second structure includes a group comprising tin or any other whisker material, wherein said first matrix material is configured to be a physical impediment to said second structure.

12. An intrusive structure mitigation structure comprising:
a plurality of first structures comprising a wall structure completely surrounding a liquid, wherein said liquid is configured to be an electrically insulating chemical capable of forming a physical barrier to electrical conduction upon exit from said first structures and further configured to have adhesive properties; and
a second structure comprising a first matrix material that comprises a plurality of randomly oriented fibers;
wherein said liquid is adapted to bond to at least a third structure and thus create an insulative layer on said third structure, wherein said wall structure adapted to be frangible or rupturable such that said wall structure may be broken or fractured by said third structure when said third structure comes in contact with said wall structure and applies at least a first force to said wall structure;
wherein said first matrix material is further adapted to have an elastic modulus higher than said third structure material so that movement of said third structure is diverted or arrested as said third structure moves into contact or within said first matrix material.

13. An intrusive structure mitigation structure as in claim 12, wherein said liquid is configured to not chemically interact or bond with the wall structure.

14. An intrusive structure mitigation structure as in claim 12, wherein said liquid is comprised of any insulative epoxy, silicone, polyurethane, polysulfide, or cyanoacrylates.

15. An intrusive structure mitigation structure as in claim 12, wherein said liquid contains two-ethylhexanois acid adapted to bond with a tin oxide film on a whisker.

16. A method of manufacture of an intrusive structure mitigation system comprising the steps of:
providing a plurality of first structures formed to encapsulate a liquid with insulative and adhesive properties, wherein said first structures are formed to rupture or fracture and thereby enable said liquid to exit said rupture or fracture of said first structures upon application of at least a first force to at least one of said structures;
filling said plurality of first structure with a liquid, wherein said liquid has both electrically insulative and adhesive properties adapted to bind to a second structure thereby making the second structure electrically inactive or forming an insulative barrier on at least a portion of said second structure coming in contact with said liquid;
dispersing the plurality of first structures into a first matrix material such that the plurality of first structures are distributed substantially evenly throughout the first matrix material;
coating the first matrix material with some type of adhesive substance adapted to bind the first matrix material to a conformal coating of a third structure comprising at least one electrical component or section; and
applying the first matrix material to a conformal coating of said third structure such that the first matrix material and the conformal coating adhere to one another.

17. A method of manufacture of an intrusive structure mitigation system as in claim 16 further comprising the steps of:
providing a second matrix material made up of randomly oriented fiber composite textile having an elastic modulus higher than at least said second structure, wherein said second structure comprises at least one other material comprising tin whiskers;
coating the second matrix material with some type of adhesive substance adapted to bind the second matrix material to the first matrix material; and
applying the second matrix material to the first matrix material such that the two matrix materials adhere to one another.

18. A method of manufacture of an intrusive structure mitigation system as in claim 17, wherein said second matrix material is made up of orderly oriented fiber composite textile having an elastic modulus higher than at least said second structure, wherein said second structure comprises at least one other material comprising tin whiskers.

19. A method of manufacture of an intrusive structure mitigation system as in claim 16 further comprising the steps of:
providing a second matrix material;
mixing the second matrix material with randomly oriented fiber composite textile having an elastic modulus higher than any whisker material;
coating the second matrix material with some type of adhesive substance adapted to bind the second matrix material to the first matrix material; and
applying the second matrix material to the first matrix material such that the two matrix materials adhere to one another.

20. A method of manufacture of an intrusive structure mitigation system as in claim 18 further comprising the steps of:
filling a plurality of third structures with a liquid that is electrically insulative and has adhesive properties adapted to bind to a whisker thereby making the whisker electrically inactive;
dispersing the plurality of third structures into a matrix material such that the plurality of third structures are distributed substantially evenly throughout a third matrix material;
coating the third matrix material with some type of adhesive substance adapted to bind the third matrix material to the second matrix material; and
applying the third matrix material to the second matrix material such that the third matrix material and the second matrix material adhere to one another.

21. A method of manufacture of an intrusive structure mitigation system comprising the steps of:
providing a matrix material made up of randomly oriented fiber composite textile having an elastic modulus higher than any whisker material;
filling a plurality of first structures with a liquid that is electrically insulative and has adhesive properties adapted to bind to a whisker thereby making the whisker electrically inactive;
dispersing said plurality of first structures into said matrix material such that said plurality of first structures are distributed substantially evenly throughout said matrix material;
coating said matrix material with some type of adhesive substance adapted to bind said matrix material to a conformal coating of a printed circuit board (PCB); and
applying said matrix material to said conformal coating of a PCB such that said matrix material and said conformal coating adhere to one another.

22. An intrusive structure mitigation system as in claim 1, wherein said liquid comprises silicone oils and several adhesive sealants adapted to bond to a material and render said material electrical inactive.

23. An intrusive structure mitigation system as in claim 3, wherein said second matrix material comprises orderly oriented fiber adapted to have an elastic modulus higher than said second structure material.

24. An intrusive structure mitigation structure as in claim 12, wherein said liquid is adapted to be detected by a sensor instrument such that the presence of puncturing structures can be detected.

25. An intrusive structure mitigation structure as in claim 24, wherein said liquid is further adapted with a colorant or another material such that the presence of a puncturing structure is detectable by detecting the presence of said colorant or said another material which produces a detectable predetermined electromagnetic radiation signature.

26. An intrusive structure mitigation structure as in claim 1, wherein said liquid is further adapted to comprise a material which produces a detectable electromagnetic or visual indication after said liquid exits from at least one said first structure.

27. An intrusive structure mitigation system as in claim 1, wherein said conformal coating is a coating of a printed circuit board comprising a tin finish or a solder finish.

28. An intrusive structure mitigation system as in claim 1, wherein said first matrix material comprises a plurality of randomly oriented fibers adapted to have an elastic modulus higher than said second structure material so as to divert or arrest movement of said second structure so as to reduce or eliminate an electrical contact with said third structure.

29. A method of manufacture of an intrusive structure mitigation system as in claim 16, wherein said first matrix material is made up of randomly oriented fiber composite textile having an elastic modulus higher than at least said second structure, wherein said second structure comprises at least one other material comprising tin whiskers.

\* \* \* \* \*